United States Patent
Cho et al.

(10) Patent No.: US 10,175,532 B2
(45) Date of Patent: *Jan. 8, 2019

(54) DISPLAY MODULE AND DISPLAY APPARATUS HAVING THE SAME

(71) Applicant: SAMSUNG ELECTRONICS CO., LTD., Suwon-si (KR)

(72) Inventors: Byoung Jin Cho, Anyang-si (KR); Young Man Ahn, Suwon-si (KR); Dae Hee Lee, Hwaseong-si (KR); Nae Won Jang, Suwon-si (KR); Hyeong Sik Choi, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/693,958

(22) Filed: Sep. 1, 2017

(65) Prior Publication Data

US 2018/0011376 A1 Jan. 11, 2018

Related U.S. Application Data

(63) Continuation of application No. 14/809,790, filed on Jul. 27, 2015, now Pat. No. 9,785,008, which is a
(Continued)

(30) Foreign Application Priority Data

Jan. 31, 2013 (KR) .................. 10-2013-0011150

(51) Int. Cl.
*G02F 1/1335* (2006.01)
*G02B 5/02* (2006.01)
(Continued)

(52) U.S. Cl.
CPC .. *G02F 1/133611* (2013.01); *G02F 1/133603* (2013.01); *G02F 1/133605* (2013.01);
(Continued)

(58) Field of Classification Search
CPC ......... G02F 1/133611; G02F 1/133603; G02F 1/133605; G02F 1/133608; G02F 1/133606; G02B 5/124; G02B 5/02; H01L 33/54
See application file for complete search history.

(56) References Cited

U.S. PATENT DOCUMENTS

| 8,890,905 B2 | 11/2014 | Kwong |
| 2004/0032725 A1 | 2/2004 | Hsieh et al. |

(Continued)

FOREIGN PATENT DOCUMENTS

| CN | 102081187 A | 6/2011 |
| CN | 102449376 A | 5/2012 |

(Continued)

OTHER PUBLICATIONS

Communication dated Nov. 16, 2017, issued by the State Intellectual Property Office of the People's Republic of China in counterpart Chinese Patent Application No. 201410045184.3.
(Continued)

*Primary Examiner* — Charles Chang
(74) *Attorney, Agent, or Firm* — Sughrue Mion, PLLC

(57) ABSTRACT

A display module includes a display panel; a backlight unit which is disposed behind the display panel; a bottom chassis to accommodate the backlight unit; and a reflective sheet which is disposed inside the bottom chassis and configured to reflect a light portion incident thereon toward the display panel. The backlight unit includes LEDs disposed apart from one another in 2D array, and the reflective sheet includes a sheet bottom portion corresponding to a front surface of the
(Continued)

bottom chassis, a sheet inclined portion which is obliquely formed to face a rear surface of the display panel, and light adjustment portions which are provided on the sheet inclined portion and configured to adjust the light portion reflected by the sheet inclined portion. Each of the light adjustment portions corresponds to one of the LEDs disposed adjacent to the sheet inclined portion.

19 Claims, 7 Drawing Sheets

Related U.S. Application Data continuation of application No. 14/167,514, filed on Jan. 29, 2014, now Pat. No. 9,122,100.

(51) Int. Cl.
*G02B 5/124* (2006.01)
*H01L 33/54* (2010.01)

(52) U.S. Cl.
CPC .. *G02F 1/133606* (2013.01); *G02F 1/133608* (2013.01); *G02B 5/02* (2013.01); *G02B 5/124* (2013.01); *H01L 33/54* (2013.01)

(56) References Cited

U.S. PATENT DOCUMENTS

| | | |
|---|---|---|
| 2005/0248280 A1 | 11/2005 | Hsieh et al. |
| 2008/0068528 A1 | 3/2008 | Chuang et al. |
| 2012/0069248 A1* | 3/2012 | Yokota .............. G02F 1/133605 348/739 |
| 2012/0133689 A1 | 5/2012 | Kwong |
| 2012/0287347 A1 | 11/2012 | Matsumoto |

FOREIGN PATENT DOCUMENTS

| | | | |
|---|---|---|---|
| CN | 202216081 | U | 5/2012 |
| JP | 2005-228630 | A | 8/2005 |
| JP | 4225341 | B2 | 2/2009 |
| JP | 4222081 | B2 | 2/2012 |
| JP | 2013143217 | A | 7/2013 |
| KR | 10-2006-0019654 | A | 3/2006 |
| KR | 10-2006-0095696 | A | 9/2006 |
| KR | 10-2009-0109690 | A | 10/2009 |
| KR | 10-2011-0128692 | A | 11/2011 |
| KR | 1020120008879 | A | 2/2012 |
| TW | 564302 | B | 12/2003 |
| WO | 2010/146892 | A1 | 12/2010 |
| WO | 2011/074334 | A1 | 6/2011 |
| WO | 2012/056929 | A1 | 5/2012 |

OTHER PUBLICATIONS

Communication dated Oct. 24, 2017, issued by the Japanese Patent Office in counterpart Japanese Patent Application No. 2014-015695.
Communication dated Apr. 25, 2014 from the European Patent Office in counterpart European Application No. 14153086.5.
Communication dated Apr. 25, 2016, issued by the European Patent Office in counterpart European Application No. 14153086.5.
International Search Report dated Mar. 18, 2014, from the Patent Cooperation Treaty in counterpart International Application No. PCT/KR2014/000799.
Communication issued by the Japanese Patent Office dated Jan. 30, 2018 in counterpart Japanese Patent Application No. 2014-015695.
Communication dated Jul. 4, 2018, issued by the State Intellectual Property Office of P.R. China in counterpart Chinese Application No. 201410045184.3.

* cited by examiner

DISPLAY MODULE AND DISPLAY APPARATUS HAVING THE SAME

CROSS-REFERENCE TO RELATED APPLICATIONS

This is a continuation of U.S. application Ser. No. 14/809,790 filed Jul. 27, 2015, which is a Continuation of U.S. application Ser. No. 14/167,514 filed Jan. 29, 2014, which claims priority from Korean Patent Application No. 10-2013-0011150, filed Jan. 31, 2013 in the Korean Intellectual Property Office, the disclosures of which are incorporated herein by reference in their entireties.

BACKGROUND

1. Field

Apparatuses and methods consistent with exemplary embodiments relate to a display panel to display an image through a liquid crystal, a display module having a backlight unit to emit light toward the display panel, and a display apparatus having the same.

2. Description of the Related Art

A display module is an apparatus including a display panel on which an image is displayed, and is used for various display apparatuses such as monitors and televisions.

A liquid crystal display (LCD) panel is widely used as a display panel, but the display panel using the LCD panel is unable to emit light by itself. For this reason, a backlight unit is disposed behind the display panel, and a diffusion plate to diffuse light illuminated from the backlight unit is arranged between the display panel and the backlight unit, thereby enabling light to be evenly dispersed and supplied to the entire display panel.

In addition, a display module may include a reflective sheet which is disposed on an inner side of a bottom chassis defining a rear surface of the display module to reflect light reflected to the bottom chassis toward the front of the display panel.

In the display module, only a little amount of light may be transmitted to the most peripheral side of the display panel compared with the other regions thereof. Consequently, a dark shadow may be generated at the most peripheral side of the display panel. Therefore, in order to prevent the above issue, the light source needs to be disposed close to the side portions of the display module.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

One or more of exemplary embodiments provide a display module and a display apparatus capable of reducing generation of a hotspot at a peripheral side of the display panel.

In accordance with an aspect of an exemplary embodiment, there is provided a display module includes a display panel, a backlight unit disposed behind the display panel to illuminate light toward the display panel, a bottom chassis to accommodate the backlight unit therein, and a reflective sheet disposed inside the bottom chassis to allow light illuminated from the backlight unit to be reflected forward, wherein the reflective sheet includes a sheet bottom portion corresponding to a front surface of the bottom chassis, a sheet side surface portion which is obliquely formed to face a rear surface of the display panel, and at least one light adjustment portion which is provided on the sheet side surface portion to adjust light reflected by the sheet side surface portion.

The light adjustment portion may include a plurality of slits extending parallel with the front surface of the bottom chassis.

The light adjustment portion may include a rectangular hole extending parallel with the front surface of the bottom chassis.

The light adjustment portion may include an oval hole extending parallel with the front surface of the bottom chassis.

The backlight unit may include a plurality of boards and a plurality of light emitting diodes (LEDs) disposed on the boards to be spaced apart from each other, and the at least one light adjustment portion may include a plurality of light adjustment portions formed to be space apart from each other such that the light adjustment portions correspond to LEDs disposed adjacent to the sheet side surface portion among the LEDs.

The backlight unit may include a plurality of lenses which are respectively installed on the LEDs, and the reflective sheet may include a plurality of through holes which are provided in the sheet bottom portion so that the LEDs and lenses protrude through the through holes.

In accordance with an aspect of an exemplary embodiment, there is provided a display apparatus includes a display module to display a screen, wherein the display module includes a display panel, a backlight unit disposed behind the display panel to illuminate light toward the display panel, a bottom chassis to accommodate the backlight unit therein, and a reflective sheet disposed inside the bottom chassis to allow light illuminated from the backlight unit to be reflected forward, and the reflective sheet includes a sheet bottom portion corresponding to a front surface of the bottom chassis, a sheet side surface portion which is obliquely formed to face a rear surface of the display panel, and at least one light adjustment portion which is provided on the sheet side surface portion to adjust light reflected by the sheet side surface portion.

BRIEF DESCRIPTION OF THE DRAWINGS

The above and/or other aspects will become more apparent by describing certain exemplary embodiments, with reference to the accompanying drawings, in which.

DETAILED DESCRIPTION

Figure 1:
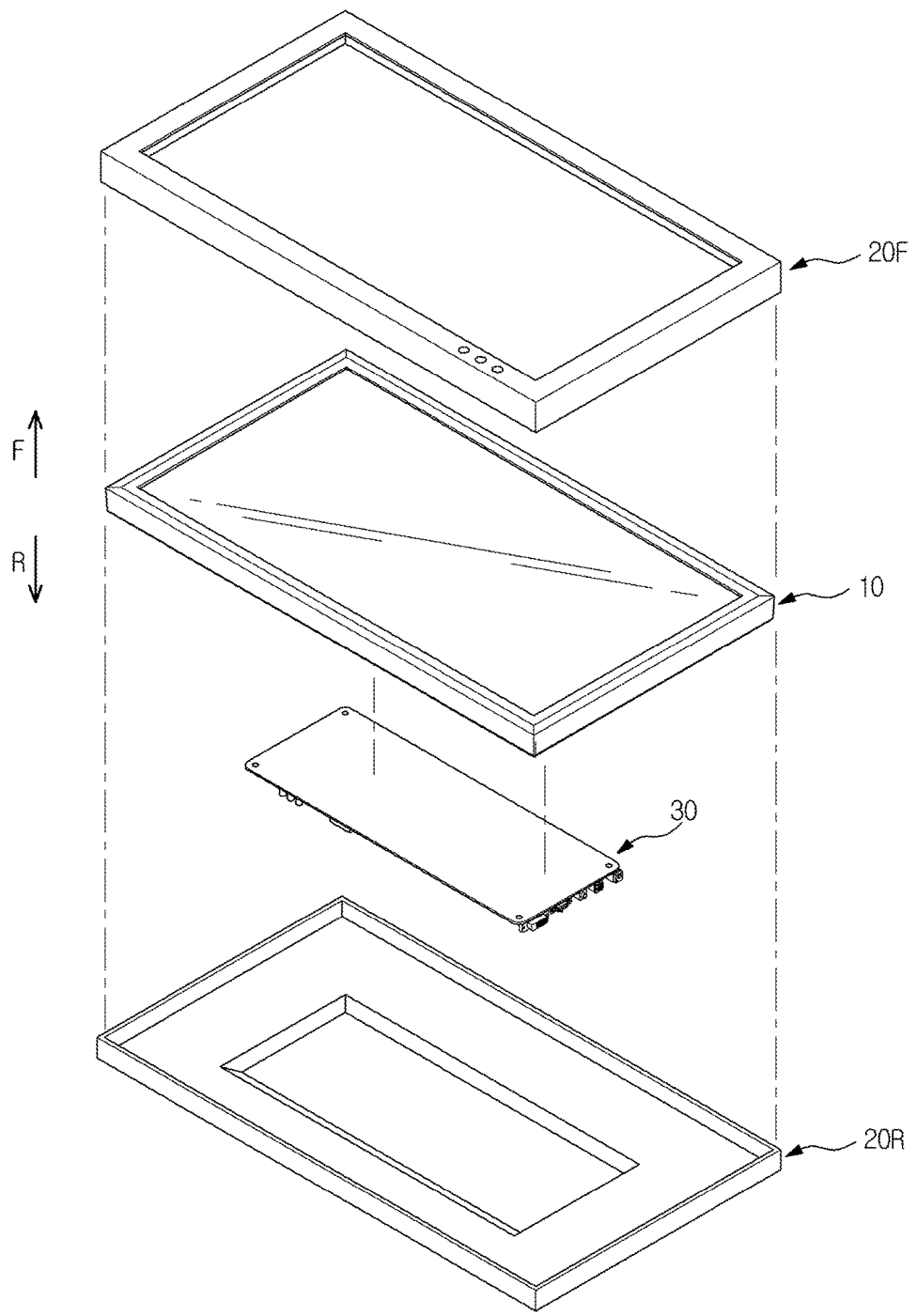
FIG. 1 is an exploded perspective view illustrating a display apparatus according to an exemplary embodiment.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

As shown in FIG. 1, a display apparatus includes a display module 10 on which an image is displayed, a front case 20F and a rear case 20R between which the display module 10 is installed while the front case 20F and the rear case 20R are coupled to each other in a forward and rearward direction. A control substrate 30 is disposed between the display module 10 and the rear case 20R to transmit power and a signal to the display module 10.

Figure 2:
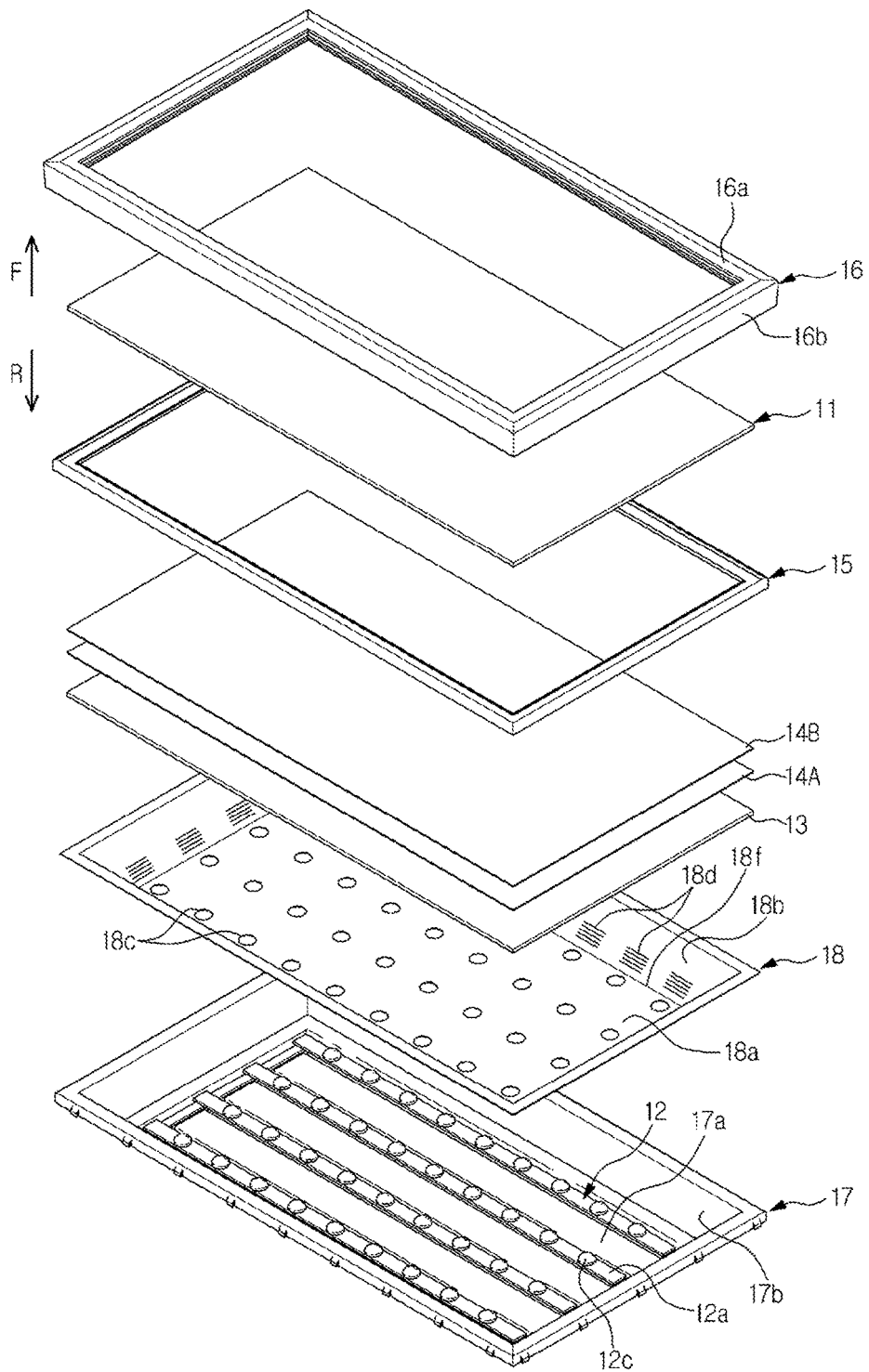
FIG. 2 is an exploded perspective view illustrating a display module according to an exemplary embodiment.
Figure 3:
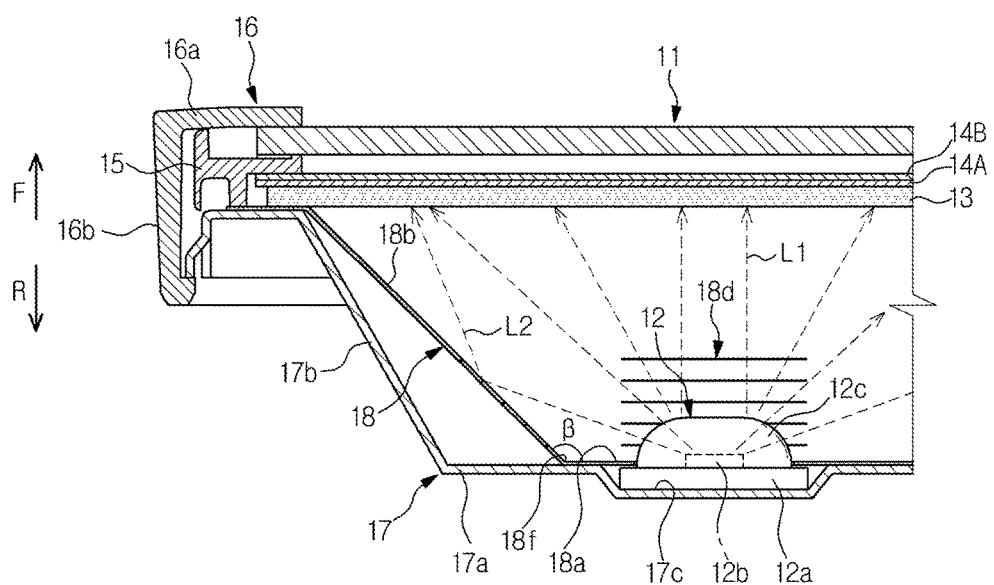
FIG. 3 is a cross-sectional view illustrating the display module according to an exemplary embodiment.

As shown in FIGS. 2 and 3, the display module 10 includes a display panel 11 which includes an LCD panel to display a screen. Backlight units 12 are disposed behind the display panel 11 and are spaced apart from each other to supply light to the display panel 11. A diffusion plate 13 is disposed behind the display panel 11 so that light illuminated from the backlight units 12 is diffused and transmitted to the display panel 11, and a variety of optical sheets 14A and 14B is disposed on a front surface of the diffusion plate 13.

The display module 10 includes a middle mold 15 to support the display panel 11 and the diffusion plate 13, and a top chassis 16 installed in front of the middle mold 15 to position the display panel 11 on the middle mold 15. The backlight units 12 are installed in a bottom chassis 17 which is installed behind the middle mold 15.

The backlight units 12 include printed circuit boards 12a which are disposed in the bottom chassis 17 while each has a conductive pattern, LEDs 12b which are installed on a front surface of each printed circuit board 12a to face the diffusion plate 13, and circular lenses 12c which are installed on the respective LEDs 12b to diffuse light generated by the LEDs 12b.

In an exemplary embodiment, each printed circuit board 12a is elongated in one direction to correspond to a length of the display panel 11. The printed circuit boards 12a are disposed to be spaced parallel with each other, in an array. The LEDs 12b and the lenses 12c installed on the respective LEDs 12b are disposed to be spaced apart from each other in a longitudinal direction of each of the printed circuit boards. The printed circuit boards 12a are connected to each other by a connection substrate 12d.

The optical sheet 14A may include a prism film to concentrate light diffused by the diffusion plate 13 in a direction perpendicular to the display panel 11, and the optical sheet 14B may include a protective film to protect the prism film.

The middle mold 15 may be embodied as a module having the display panel 11 at the front side and the diffusion plate 13 at the rear side and may provide support for the display panel 11 and the diffusion plate 13. The optical sheets 14A and 14B may be further disposed between the diffusion plate 13 and the rear side.

The top chassis 16 has a bezel portion 16a covering a front surface of a periphery of the display panel 11, and a top side surface portion 16b bent rearward from a periphery of the bezel portion 16a.

The bottom chassis 17 has a substantially rectangular shape, and includes a bottom front surface 17a on which the backlight units 12 are positioned and a bottom side surface 17b extending toward the display panel from a periphery of the bottom front surface 17a. The bottom front surface 17b has seating grooves 17c which are recessed so that the printed circuit boards 12a of the backlight units 12 are respectively positioned in the seating grooves 17c.

The display module 10 includes a reflective sheet 18 which is disposed inside the bottom chassis 17 to reflect light illuminated toward the inside of the bottom chassis 17 toward the display panel 11.

The reflective sheet 18 includes a sheet bottom portion 18a which is disposed at the bottom front surface 17a which defines the front surface of the bottom chassis 17, and a sheet inclined portion 18b which extends toward the display panel from a peripheral edge 18f of the sheet bottom portion 18a.

The sheet bottom portion 18a is provided with holes 18c at respective positions corresponding to each of the LEDs 12b and the lenses 12c so that the LEDs 12b and the lenses 12c protrude through the reflective sheet 18 through the holes 18c. The light L1 generated by the LEDs 12b is emitted toward the display panel 11 in a forward direction F, and a portion the light reflected in a rearward direction R by the diffusion plate 13 or the like is reflected in the forward direction by the reflective sheet 18.

The sheet inclined portion 18b extends toward the display panel 11 from the periphery of the sheet bottom portion 18a, namely from up-down-left-right tips of the sheet bottom portion 18a, and is obliquely formed, at an oblique angle β with respect to a plane of the sheet bottom portion 18a, to face the rear surface of the display panel 11. Consequently, a light portion L2 emitted by the LEDs 12b and incident on the sheet inclined portion 18b may be reflected toward the display panel 11. In an exemplary embodiment, since the diffusion plate 13 is disposed behind the display panel 11, the sheet inclined portion 18b is obliquely formed to face the rear surface of the diffusion plate 13.

In the display module 10, only a little amount of light may be transmitted to the most peripheral side of the display panel 11 compared with the other regions thereof. Consequently, a dark shadow may be generated at the most peripheral side of the display panel 11 compared with the other regions. Therefore, in order to prevent the above issue, the LEDs 12b need to be disposed substantially close to the sheet inclined portion 18b.

However, in a case in which the LEDs 12b are installed adjacent to the sheet inclined portion 18b, light L1 directly emitted by the LEDs 12b and the light L2 reflected by the sheet inclined portion 18b may simultaneously reach a region of the display panel 11 adjacent to the LEDs 12b, and, thus, a light hotspot may be generated at a tip side of the display panel 11 adjacent to the LEDs 12b as compared with other regions.

Figure 4:
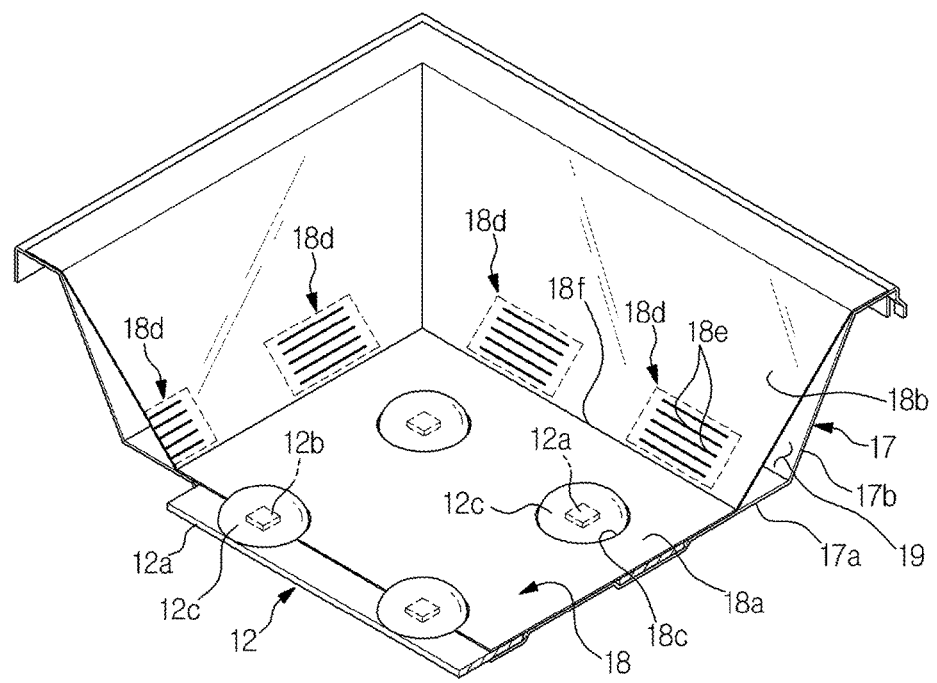
FIG. 4 is a perspective view illustrating light adjustment portions to an exemplary embodiment.

Accordingly, to prevent the above issue, the sheet inclined portion 18b may be provided with one or several light adjustment portions 18d to partially adjust light reflected by the sheet inclined portion 18b, as shown in FIG. 4.

In an exemplary embodiment, the light adjustment portions 18d respectively correspond to the LEDs 12b which are disposed adjacent to the sheet inclined portion 18b. Furthermore, in an exemplary embodiment, each of the light adjustment portions 18d includes a plurality of slits 18e which extend in parallel with the bottom front surface 17a of the bottom chassis 17. For example, the slits 18e may extend in parallel with the peripheral edge 18f disposed between the sheet bottom portion 18a and the sheet inclined portion 18b.

The light adjustment portion 18*d* configured of the slits 18*e* is formed by thin cutting the sheet inclined portion 18*b* in a linear form. Accordingly, a portion of light incident toward the light adjustment portion 18*d* may leak to a space 19 between the sheet inclined portion 18*b* and the bottom side surface 17*b* through the slits 18*e*.

In addition, portions adjacent to the slits may be deformed convexly or concavely in the process of forming the light adjustment portion 18*d* by cutting the sheet inclined portion 18*b*. Thus, a portion of light incident upon the light adjustment portion 18*d* may be dispersed in longitudinal directions of the slits due to shapes of the adjacent portions.

Accordingly, a portion of light incident toward the light adjustment portion 18*d* leaks through the slits, and is dispersed in the longitudinal directions of the slits by the adjacent portions of the slits. Consequently, it may be possible to reduce a hotspot generated when light is concentrated at a particular region.

Figure 5:
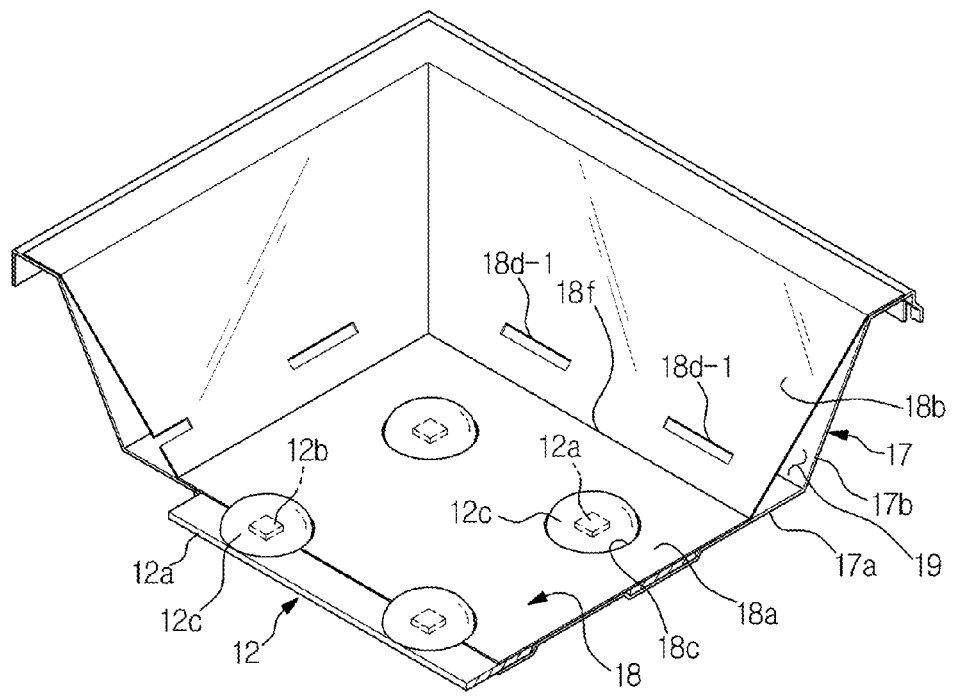
FIG. 5 is a perspective view illustrating light adjustment portions according to an exemplary embodiment.

In an exemplary embodiment, the light adjustment portion 18*d* is formed by the slits extending in parallel with each other, but this is not limiting. As shown in FIG. 5, a light adjustment portion 18*d*-1 may be formed as a rectangular hole extending in parallel with the bottom front surface 17*a*. For example, a lengthwise direction of the rectangular hole may extend in parallel with the peripheral edge 18*f*.

Figure 6:
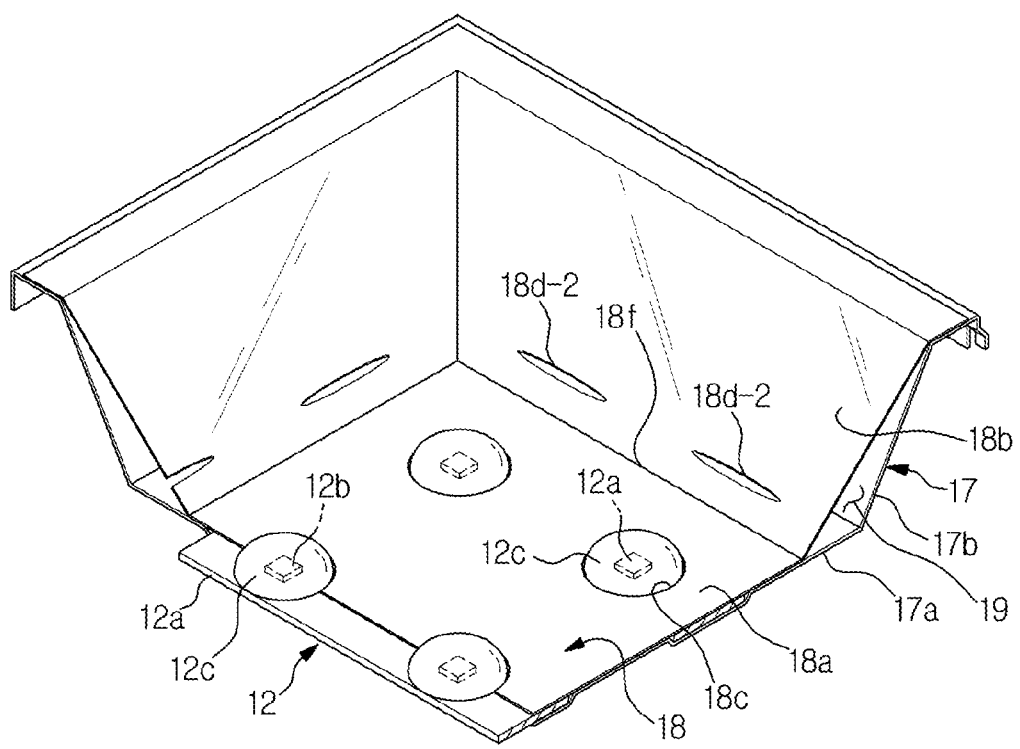
FIG. 6 is a perspective view illustrating light adjustment portions according to an exemplary embodiment.

As another example, as shown in FIG. 6, a light adjustment portion 18*d*-2 may be formed as an oval hole extending in parallel with the bottom front surface 17*a*. For example, a lengthwise direction of the oval hole may extend in parallel with the peripheral edge 18*f*.

When the light adjustment portion 18*d*-1 or 18*d*-2 is formed as a rectangular hole or an oval hole, a portion of light emitted by the LEDs 12*b* and incident on the sheet inclined portion 18*b* may leak to a space 19 between the sheet inclined portion 18*b* and the bottom side surface 17*b* through the rectangular hole or the oval hole. Therefore, the light reflected toward the periphery of the display panel 11 by the sheet inclined portion 18*b* is decreased, thereby reducing generation of hotspots.

Figure 7:
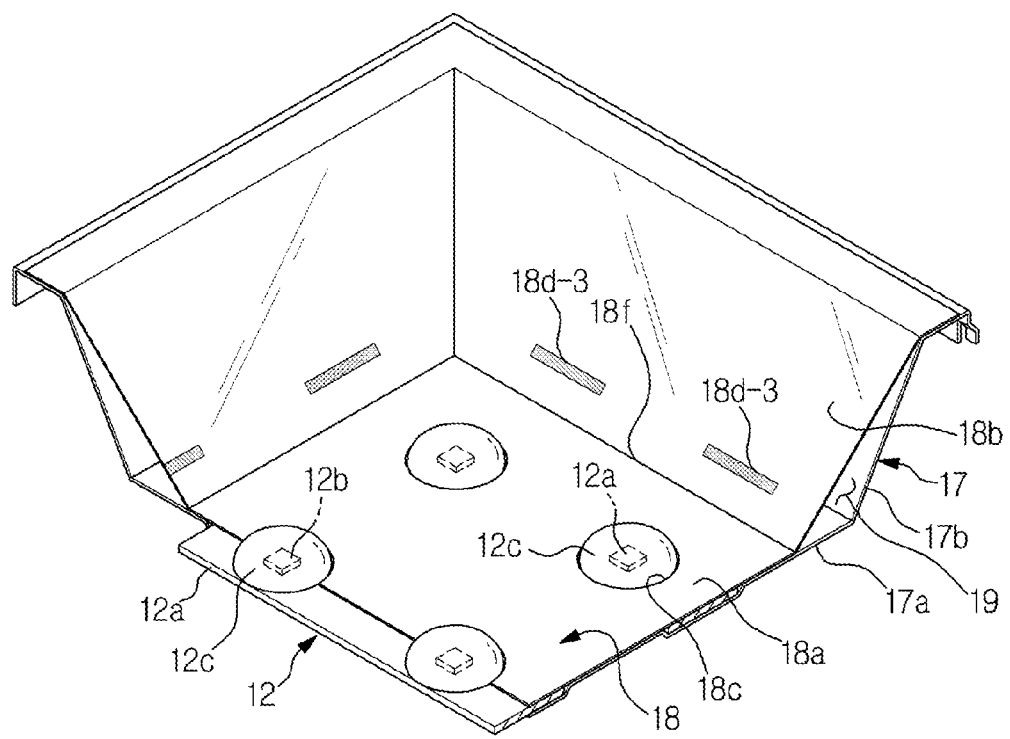
FIG. 7 is a perspective view illustrating light adjustment portions according to an exemplary embodiment.

In addition, as shown in FIG. 7, a light adjustment portion 18*d*-3 may be formed by a light diffusion layer made by applying or coating a light diffusion material on the sheet inclined portion 18*b*.

As apparent from the above description, since a light adjustment portion is provided on a sheet side surface portion of a reflective sheet and an amount of light reflected by the sheet side surface portion of the reflective sheet is reduced or dispersed, it may be possible to reduce generation of a hotspot at a peripheral side of a display panel.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A display module comprising:
   a display panel;
   a plurality of light emitting diodes (LEDs) disposed behind the display panel and spaced from the display panel to emit light toward the display panel;
   a bottom chassis configured to accommodate the plurality of LEDs; and
   a reflective sheet disposed inside the bottom chassis and configured to reflect a light portion incident thereon toward the display panel, the reflective sheet comprising:
      a sheet bottom portion corresponding to a front surface of the bottom chassis,
      sheet inclined portions obliquely formed to face a rear surface of the display panel, and
      a plurality of light adjustment portions provided on respective sheet inclined portions and configured to adjust the light portion incident on the respective sheet inclined portions,
   wherein each of the plurality of light adjustment portions disposed on a respective sheet inclined portion corresponds to one of the plurality of LEDs disposed adjacent to the respective sheet inclined portion in a one to one relationship, and
   wherein the plurality of light adjustment portions extends in parallel with the front surface of the bottom chassis.

2. The display module according to claim 1, wherein the plurality of light adjustment portions comprises at least one among slits, a rectangular hole, and an oval hole extending in parallel with the front surface of the bottom chassis.

3. The display module according to claim 2, wherein at least one of the plurality of light adjustment portions comprises the slits extending in parallel with the front surface of the bottom chassis.

4. The display module according to claim 2, wherein at least one of the plurality of light adjustment portions comprises the rectangular hole extending in parallel with the front surface of the bottom chassis.

5. The display module according to claim 2, wherein at least one of the plurality of light adjustment portions comprises the oval hole extending in parallel with the front surface of the bottom chassis.

6. The display module according to claim 1, further comprising boards on which the plurality of LEDs are disposed, and lenses installed on respective LEDs among the plurality of LEDs,
   wherein the sheet bottom portion comprises holes so that the respective LEDs and the lenses protrude through the holes.

7. A display apparatus comprising:
   a display module configured to display a screen, and comprises:
      a display panel,
      a plurality of light emitting diodes (LEDs) disposed behind the display panel and spaced from the display panel to emit light toward the display panel,
      a bottom chassis configured to accommodate the plurality of LEDs, and
      a reflective sheet disposed inside the bottom chassis and is configured to reflect a light portion incident thereon toward the display panel, the reflective sheet comprising:
         a sheet bottom portion corresponding to a front surface of the bottom chassis,
         sheet inclined portions obliquely formed to face a rear surface of the display panel, and
         a plurality of light adjustment portions provided on respective sheet inclined portions and configured to adjust the light portion incident on the respective sheet inclined portions,
      wherein each of the plurality of light adjustment portions disposed on a respective sheet inclined portion corresponds to one of the plurality of LEDs disposed adjacent to the respective sheet inclined portion in a one to one relationship, and
wherein the plurality of light adjustment portions extends in parallel with the front surface of the bottom chassis.

8. The display module according to claim 7, wherein the plurality of light adjustment portions comprises at least one among slits, a rectangular hole, and an oval hole extending in parallel with the front surface of the bottom chassis.

9. The display apparatus according to claim 8, wherein at least one of the plurality of light adjustment portions comprises the slits extending in parallel with the front surface of the bottom chassis.

10. The display apparatus according to claim 8, wherein at least one of the plurality of light adjustment portions comprises the rectangular hole extending in parallel with the front surface of the bottom chassis.

11. The display apparatus according to claim 8, wherein at least one of the plurality of light adjustment portions comprises the oval hole extending in parallel with the front surface of the bottom chassis.

12. The display apparatus according to claim 7, further comprising boards on which the plurality of LEDs are disposed, and lenses installed on respective LEDs among the plurality of LEDs,
wherein the sheet bottom portion comprises holes through which the respective LEDs and the lenses protrude.

13. A display apparatus comprising:
a display panel;
a plurality of light emitting diodes (LEDs) disposed behind the display panel and spaced from the display panel to emit light toward the display panel;
a bottom chassis configured to accommodate the plurality of LEDs; and
a reflective member disposed inside the bottom chassis and configured to reflect a light portion incident thereon toward the display panel, the reflective member comprising:
a reflective bottom portion corresponding to a front surface of the bottom chassis,
reflective inclined portions obliquely formed to face a rear surface of the display panel, and
a pattern portion formed on the respective inclined portions, the pattern portion configured to adjust light incident on the reflective inclined portions, the pattern portion comprising a plurality of pattern groups discretely formed on each of the reflective inclined portions as discrete pattern groups, each of the discrete pattern groups being positioned on the reflective inclined portions to adjust light emitted from an adjacent LED,
wherein each of the discrete pattern groups comprises members grouped together, and
wherein the reflective inclined portions include disjoint areas free of the members of the discrete pattern groups, the disjoint areas being provided between each pair of two adjacent discrete pattern groups.

14. The display apparatus according to claim 13, wherein the pattern portion comprises at least one among slits, a rectangular hole, and an oval hole.

15. The display apparatus according to claim 13, wherein the pattern portion comprises slits which extend in parallel with the front surface of the bottom chassis.

16. The display apparatus according to claim 13, wherein the pattern portion comprises a rectangular hole which extends in parallel with the front surface of the bottom chassis.

17. The display apparatus according to claim 13, wherein the pattern portion comprises an oval hole which extends in parallel with the front surface of the bottom chassis.

18. The display apparatus according to claim 13, wherein the pattern portion includes repetition portions including openings arranged on the reflective inclined portions.

19. The display apparatus according to claim 13, wherein the plurality of pattern groups forms repetition portions arranged on the reflective inclined portions, and
the members include openings grouped together.

* * * * *